(12) United States Patent
Bao et al.

(10) Patent No.: US 11,735,593 B2
(45) Date of Patent: Aug. 22, 2023

(54) GATE STACK DIPOLE COMPENSATION FOR THRESHOLD VOLTAGE DEFINITION IN TRANSISTORS

(71) Applicant: International Business Machines Corporation, Armonk, NY (US)

(72) Inventors: Ruqiang Bao, Niskayuna, NY (US); Jingyun Zhang, Albany, NY (US); Koji Watanabe, Yokohama (JP); Jing Guo, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/519,541

(22) Filed: Nov. 4, 2021

(65) Prior Publication Data

US 2023/0134180 A1 May 4, 2023

(51) Int. Cl.
*H01L 27/12* (2006.01)
*H01L 21/8234* (2006.01)
*H01L 21/84* (2006.01)
*H01L 21/8238* (2006.01)

(52) U.S. Cl.
CPC .. *H01L 27/1203* (2013.01); *H01L 21/823807* (2013.01); *H01L 21/84* (2013.01)

(58) Field of Classification Search
CPC .............. H01L 27/1203; H01L 21/84; H01L 21/823807; H01L 21/823642; H01L 21/814; H01L 27/092; H01L 29/7843
USPC ........................................... 257/369; 436/199
See application file for complete search history.

(56) References Cited

U.S. PATENT DOCUMENTS

| 8,298,927 | B2 | 10/2012 | Xu |
| 8,410,541 | B2 | 4/2013 | Wang |
| 8,410,555 | B2 | 4/2013 | Wang |
| 8,658,501 | B2 | 2/2014 | Guha |
| 9,379,023 | B2 | 6/2016 | Lee |
| 9,659,828 | B2 | 5/2017 | Ji |

(Continued)

FOREIGN PATENT DOCUMENTS

CN 102299156 A 12/2011

OTHER PUBLICATIONS

Ramanan N, Lee B, Misra V. "ALD gate dielectrics for improved threshold voltage stability in AlGaN/GaN MOS-HFETs for power applications." Semiconductor Science and Technology. Nov. 20, 2015;30(12):125017.

(Continued)

*Primary Examiner* — Thinh T Nguyen
(74) *Attorney, Agent, or Firm* — Samuel Waldbaum; Otterstedt & Kammer PLLC

(57) ABSTRACT

A semiconductor structure includes a semiconductor substrate, with first, second, and third field effect transistors (FETs) formed on the substrate. A gate of the first FET includes a gate electrode, a first work function metal (WFM) layered with a first interfacial layer (IL) and a first high-k dielectric (HK); a gate of the second FET includes the first WFM layered with a second IL, a second HK, and a first dipole material; and a gate of the third FET includes the first WFM layered with a third IL, a third HK, the first dipole material, and a second dipole material. The first FET does not include the first dipole material and does not include the second dipole material, and the second FET does not include the second dipole material.

11 Claims, 8 Drawing Sheets

(56) References Cited

U.S. PATENT DOCUMENTS

| | | |
|---|---|---|
| 10,128,347 B2 | 11/2018 | Bao |
| 10,546,787 B2 | 1/2020 | Bao |
| 2006/0113531 A1 | 6/2006 | Halik |
| 2019/0371903 A1 | 12/2019 | Bao |
| 2020/0013898 A1* | 1/2020 | Yim et al. ......... H01L 29/78391 |

OTHER PUBLICATIONS

Ramanan et ai. "ALD gate dielectrics for improved threshold voltage stability in AlGaN/GaN MOS-HFETs for power applications" 2015 Semicond. Sci. Technol. 30 125017. pp. 1-8.

* cited by examiner

200

202
Obtain first precursor structure of substrate, interlayer dielectric, and high-K layer

204
Produce second precursor structure by depositing first dipole ultra-thin film

206
Produce third precursor structure by depositing second high-k layer

208
Produce fourth precursor structure by depositing second dipole ultra-thin film

210
Produce fifth precursor structure by depositing metal capping layer, anneal capping layer, and thermal annealing

212
Complete semiconductor structure by removing metal capping layer, anneal capping layer, and forming work function metal layer

*FIG. 3*

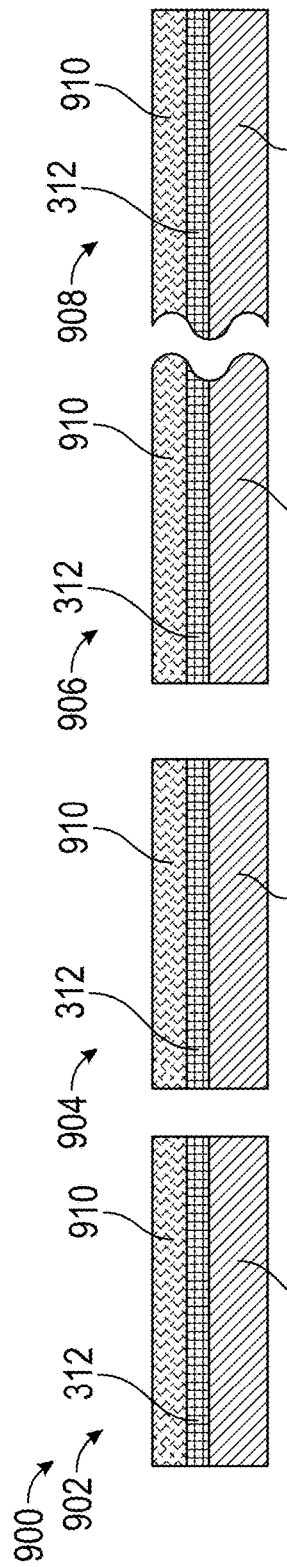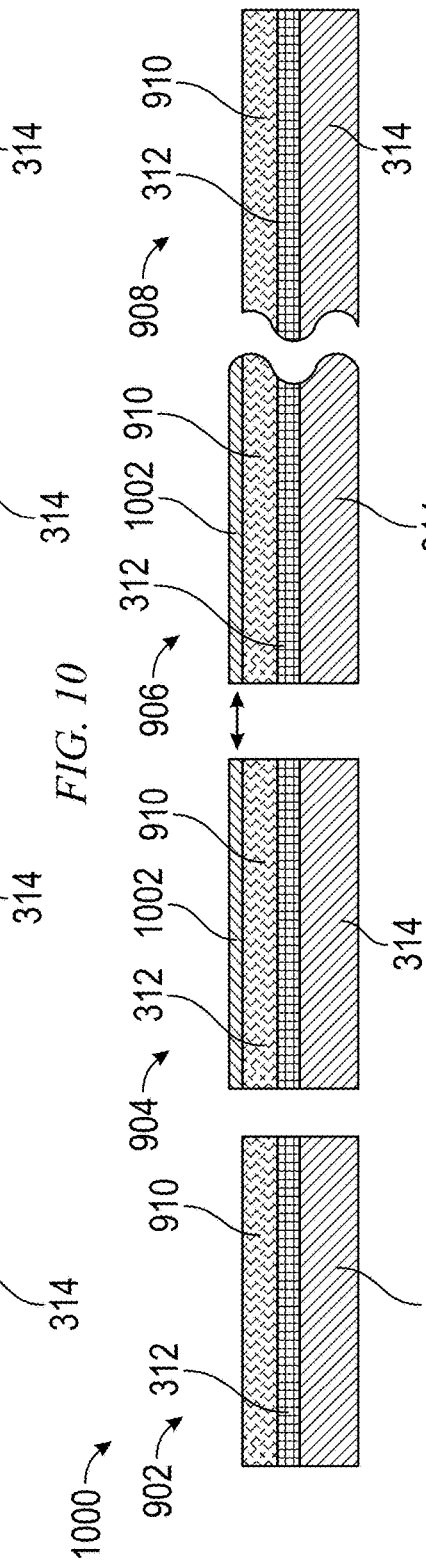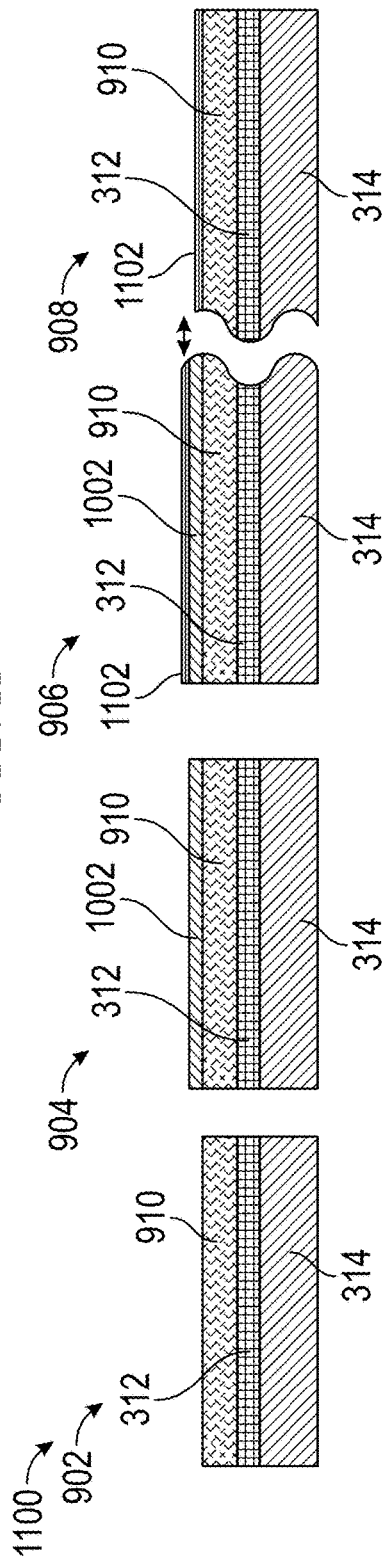

GATE STACK DIPOLE COMPENSATION FOR THRESHOLD VOLTAGE DEFINITION IN TRANSISTORS

BACKGROUND

The present invention relates to the electrical, electronic, and computer arts, and more specifically, to field-effect transistors (FETs).

Threshold voltage (Vt) is a property of FETs (the minimum gate-to-source voltage $V_{GS\,(th)}$ that is needed to create a conducting path between the source and drain terminals) that determines when a transistor turns on (conducting relatively large current) or off (permitting only a relatively small leakage current). To reduce power consumption, it is desirable to have a low value for threshold voltage to improve transistor performance by reducing the applied voltage. For efficient power distribution, it is desirable to have varied values for threshold voltage of adjacent or nearby transistors so that high performance transistors can use low Vt but low leakage transistors such as static random access memory (SRAM) can use high Vt.

SUMMARY

Principles of the invention provide techniques for gate stack dipole compensation for threshold voltage definition in transistors. In one aspect, an exemplary semiconductor structure includes a semiconductor substrate, a first n-type field effect transistor (FET) formed on the substrate, and a second nFET formed on the substrate. The first nFET has a first threshold voltage (Vt0) and a gate of the first nFET includes a gate electrode, a first work function metal (WFM) layered with a first interfacial layer (IL) and a first high-k dielectric (HK). The second nFET has a second threshold voltage (Vt1) and a gate of the second nFET includes a gate electrode and the first WFM layered with a second IL, a second HK, and a first dipole material. The exemplary semiconductor structure also includes a third nFET formed on the substrate. The third nFET has a third threshold voltage (Vt2) and a gate of the third nFET includes a gate electrode and the first WFM layered with a third IL, a third HK, the first dipole material, and a second dipole material. The first nFET does not include the first dipole material and does not include the second dipole material, and the second nFET does not include the second dipole material, such that Vt1<Vt2<Vt0.

In another aspect, the FETs are p-type and |Vt0|<|Vt2|<|Vt1|.

In another aspect, a semiconductor structure includes a semiconductor substrate; a first field effect transistor (FET) formed on the substrate; and a second field effect transistor (FET) formed on the substrate. The first field effect transistor is an n-type field effect transistor (nFET). The nFET has a first threshold voltage (Vt0) and a gate of the nFET includes a gate electrode and a first work function metal (WFM) layered with a first interfacial layer (IL), a first high-k dielectric (HK), and a first dipole material. The second field effect transistor is a p-type FET (pFET). The pFET has a second threshold voltage (Vt1) and a gate of the pFET comprises a gate electrode and a first work function metal (WFM) layered with a second interfacial layer, a second high-k dielectric, and a second dipole material.

In another aspect, a method for fabricating a semiconductor structure includes first obtaining a first precursor structure that includes a first template, a second template, a third template, and a fourth template, all of which include a first high-k dielectric layer and an interlayer dielectric on a common substrate; then depositing a first dipole material onto the second template and the third template, and depositing a second dipole material onto the third template and the fourth template.

In view of the foregoing, techniques of the present invention can provide substantial beneficial technical effects. For example, one or more embodiments provide one or more of:

A plurality of transistors on a common substrate, where each of the plurality of transistors has a different threshold voltage.

A plurality of transistors on a common substrate, each with a different threshold voltage, fabricated by fewer steps than achieved in the prior art.

More efficient fabrication of transistor groups with varied threshold voltages.

Defining different threshold voltages with fewer work function metal deposition steps than there are threshold voltages.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

BRIEF DESCRIPTION OF THE DRAWINGS

FIG. 3 depicts steps of a method for fabricating the structure of FIG. 1, according to an exemplary embodiment.

FIG. 10 through FIG. 14 depict precursor structures produced according to the method of FIG. 9.

DETAILED DESCRIPTION

Embodiments of the invention have two or more chemical dipole materials co-existing between the interlayer dielectric (IL) and high-k dielectric (HK) in a semiconductor structure. One dipole shifts threshold voltage (Vt) toward a valence band of the semiconductor in the structure, and another shifts Vt toward the conduction band. Therefore, each of the dipoles individually, as well as one or more combinations of the coexisting dipoles, can be used to define multiple Vt for multiple devices on the semiconductor structure by mutually compensating Vt shifts. For example, a dipole that shifts Vt toward the conduction band will reduce nFET (n-type Field effect transistor) Vt but raise pFET (p-type Field effect transistor) Vt; conversely, a dipole that shifts Vt toward the valence band will raise nFET Vt but lower pFET Vt. Embodiments of the invention are applicable to at least planar FETs, FinFETs (Fin-type FETs), nanosheet FETs, VTFETs (vertical transport FETs), and stack FETs.

Figure 1:
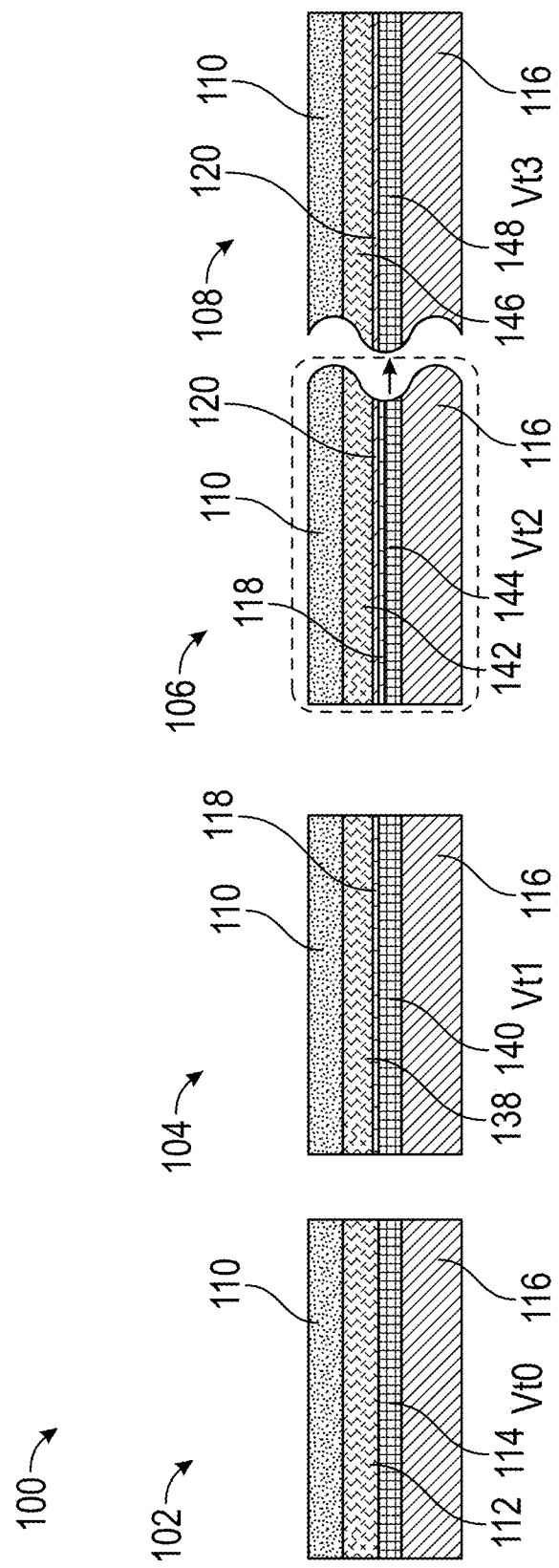
FIG. 1 depicts a simplified view of a semiconductor structure that includes four devices on a common substrate, where each device has a different threshold voltage determined by a combination of one or more dipole layers in the devices, according to an exemplary embodiment.

FIG. 1 depicts a simplified view of a semiconductor structure 100 that includes four devices 102, 104, 106, 108 on a common substrate 116, where each device has a different threshold voltage Vt0, Vt1, Vt2, Vt3 (respectively) that is determined by a combination of one or more dipole layers 118, 120 in the devices, according to an exemplary embodiment. The dipole materials include a first kind of dipole material 118 (e.g., lanthanum oxide ($La_2O_3$), although at least yttrium, magnesium, or gadolinium oxides also could be used for this purpose), which shifts the threshold voltages Vt toward a conduction band of the semiconductor. The dipole materials also include a second kind of dipole material 120 (e.g., aluminum oxide ($Al_2O_3$), although at least manganese oxide also could be used for this purpose), which shifts the threshold voltages Vt toward a valence band of the semiconductor. In one or more embodiments (not shown), more than two dipole materials may be used to provide more than four devices with a greater number of different threshold voltages.

The devices 102, 104, 106, 108 also include a work function metal (WFM) 110, high-k dielectric layers (HK), and interfacial layers (IL). In devices 104, 106, 108, one or more of the dipole materials 118, 120 are disposed at an interface between an HK and an IL. The work function metal 110 contacts each of the HKs. In fabrication of the devices 102, 104, 106, 108, initially all of the devices are covered by the same HK 112 and IL 114. However, chemical interactions between the dipole materials 118, 120 with the HK and IL mean that the finished devices 104, 106, 108 have different HK and IL which contain the dipole materials, respectively: HK 138 and IL 140 for device 104, HK 142 and IL 144 for device 106, HK 146 and IL 148 for device 108.

Figure 2:
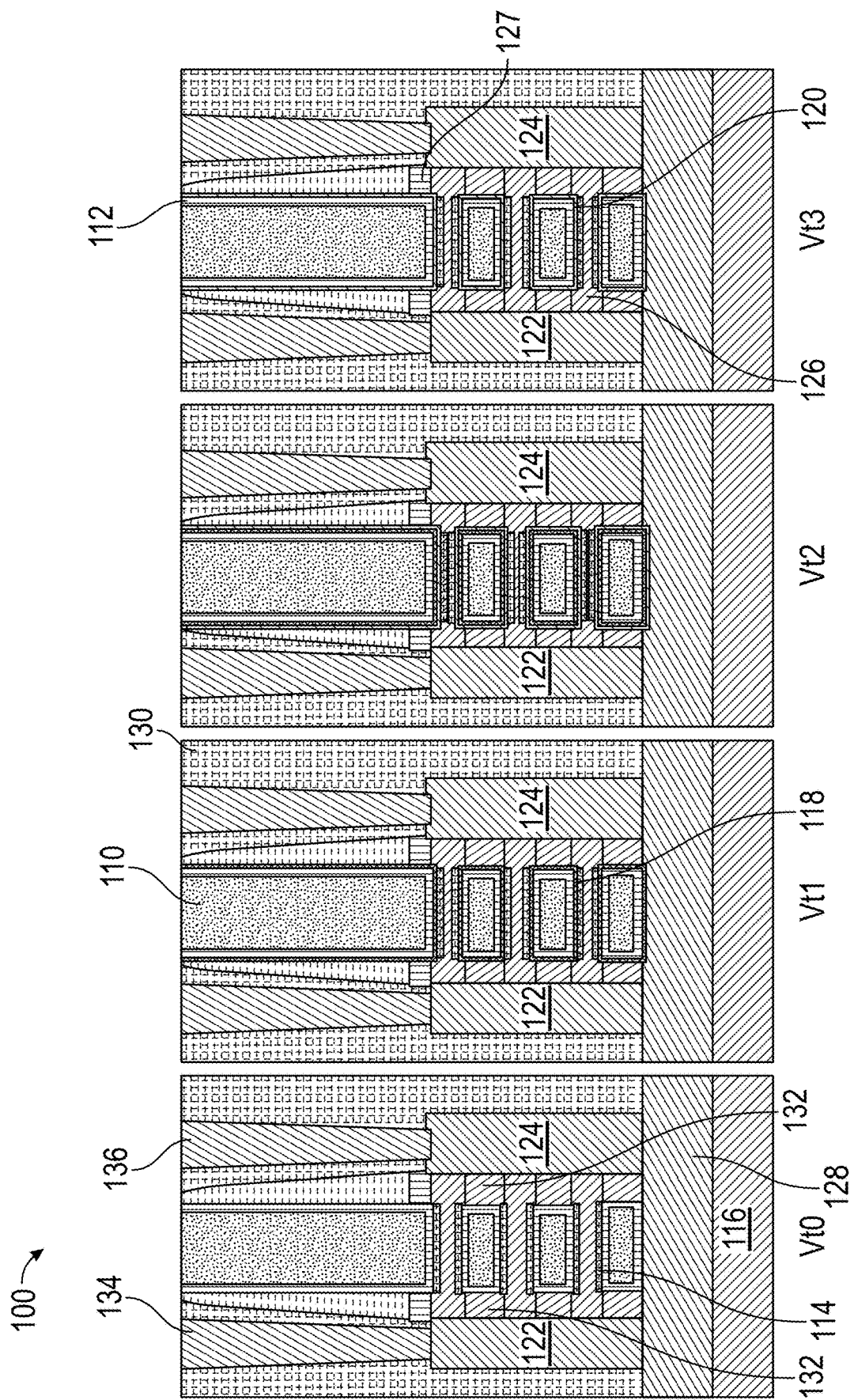
FIG. 2 depicts a fuller view of the semiconductor structure of FIG. 1.

FIG. 2 presents a more detailed view of the semiconductor structure 100, in which each of the devices 102, 104, 106, 108 forms a field effect transistor (FET) that also includes a source structure 122, a drain structure 124, and nanosheet channels 126 that connect the source structure 122 to the drain structure 124. The WFM 110 forms a gate that surrounds the fins 126. An oxide layer 127 caps the fins 126. The HK 112 and the IL 114 separate the WFM 110 from the nanosheet channels 126. A bottom dielectric isolator 128 separates the source 122 and drain 124 from the substrate 116. An interlayer dielectric (ILD) 130 covers the devices 102, 104, 106, 108. Inner spacers 132 separate the gate 110 from the source 122 and drain 124. Contacts 134, 136 penetrate the ILD 130 to connect the source 122 and drain 124 to external circuitry. In this context, the different threshold voltages Vt0, Vt1, Vt2, Vt3 can be better understood as voltages between the gate 110 and the source 122 for each device 102, 104, 106, 108 (respectively) that will establish conducting paths from the source 122 to the drain 124 through the nanosheet channels 126. As will be apparent to the skilled artisan, appropriate doping can be employed to create p-type or n-type devices.

As further used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. Examples of n-type dopants, i.e., impurities in a silicon-containing substrate include but are not limited to antimony, arsenic and phosphorous.

Figure 4:
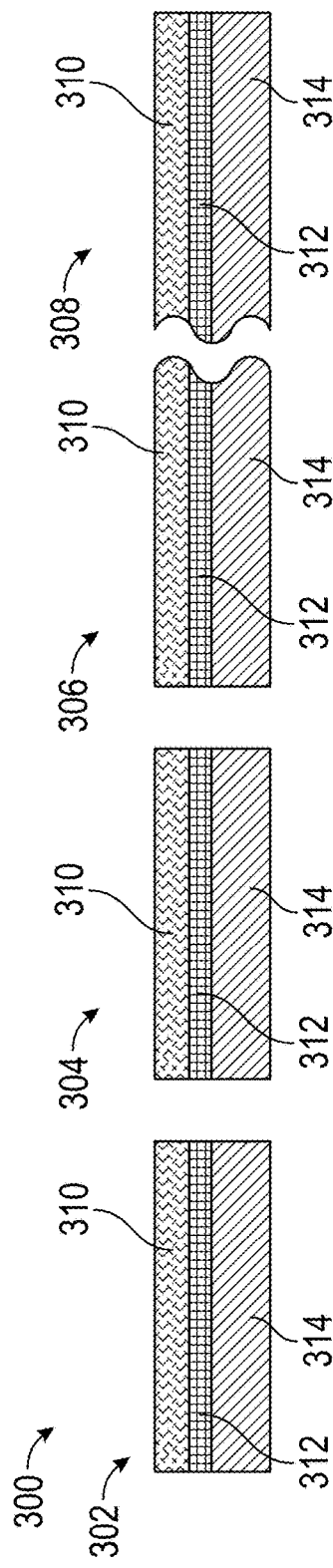
FIG. 4 through FIG. 8 depict precursor structures produced according to the method of FIG. 3.
Figure 5:
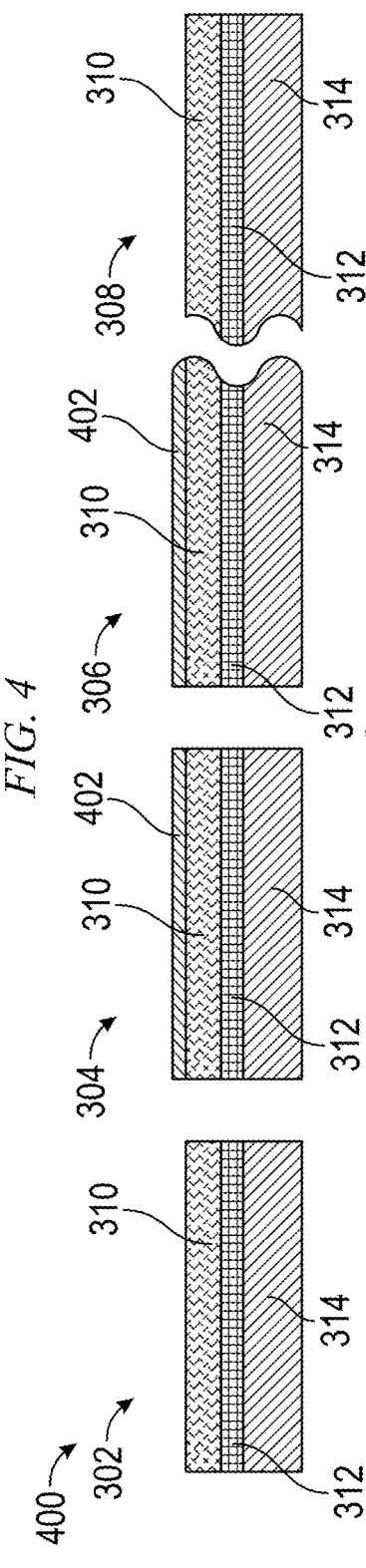

FIG. 3 depicts steps of a method 200 for fabricating the structure 100 of FIG. 1. At 202, obtain a first precursor structure 300 (as shown in FIG. 4) that includes a first template 302, a second template 304, a third template 306, and a fourth template 308 all including a first high-k dielectric layer (HK1) 310 and an interfacial dielectric (IL) 312 on a common substrate 314. In one or more embodiments, HK1 310 is composed of hafnium oxide (HfO), zirconium oxide (ZrO), or titanium oxide (TiO), or similar suitable materials with k on the order of 3-15 times higher than silicon dioxide ($SiO_2$), e.g., on the order of 10-50, and HK1 310 is on the order of 10-20 angstroms thick (in particular embodiments, between 10-14 angstroms). At 204, produce a second precursor structure 400 (as shown in FIG. 5) by depositing a first dipole material 402 onto the second template 304 and the third template 306. In one or more embodiments, the first dipole material 402 is lanthanum oxide or similar, at an "ultra-thin" thickness of 1 to 10 angstroms.

Figure 6:
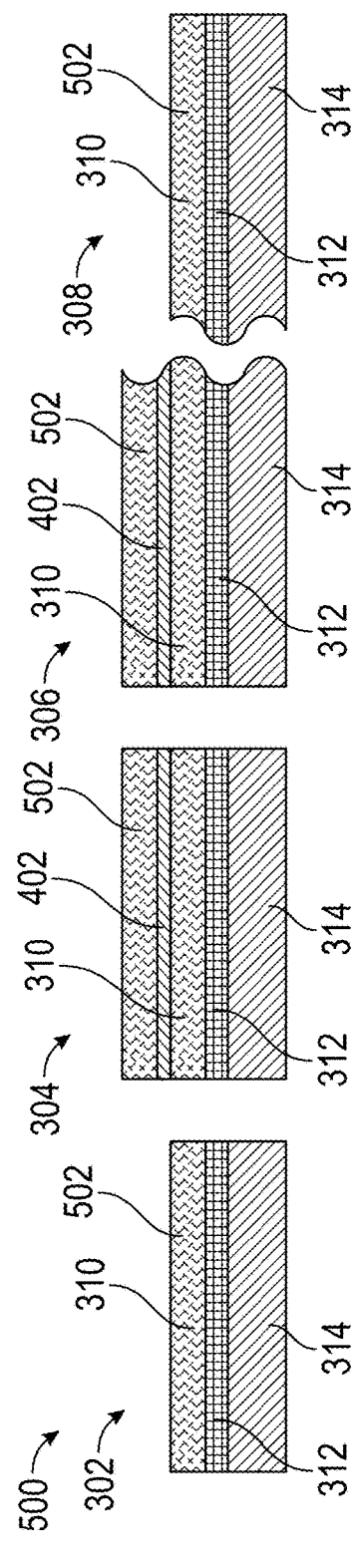
Figure 7:
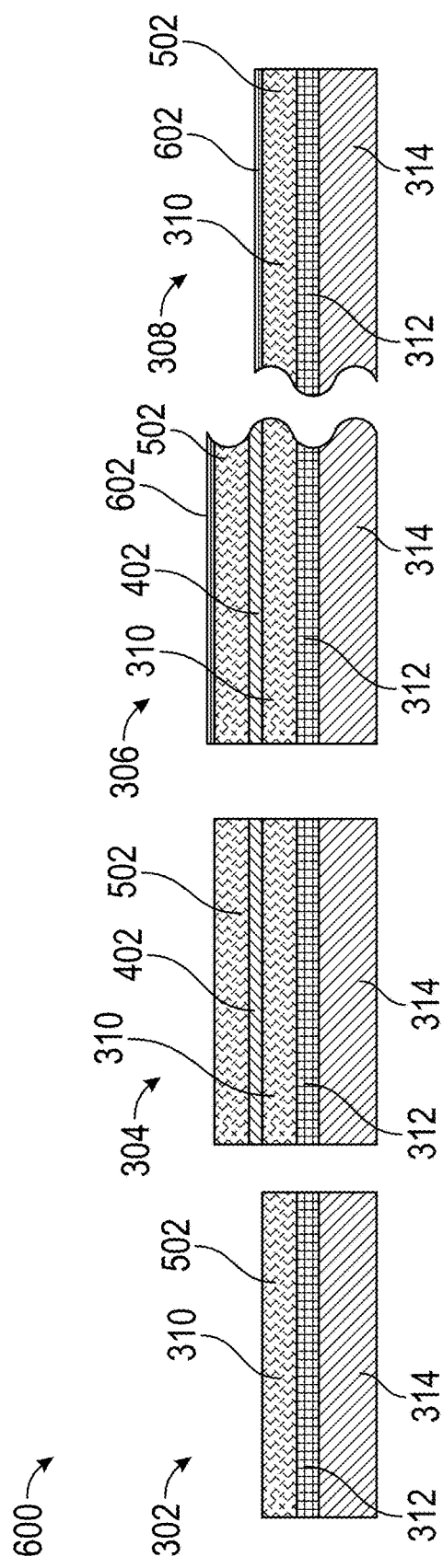
Figure 8:
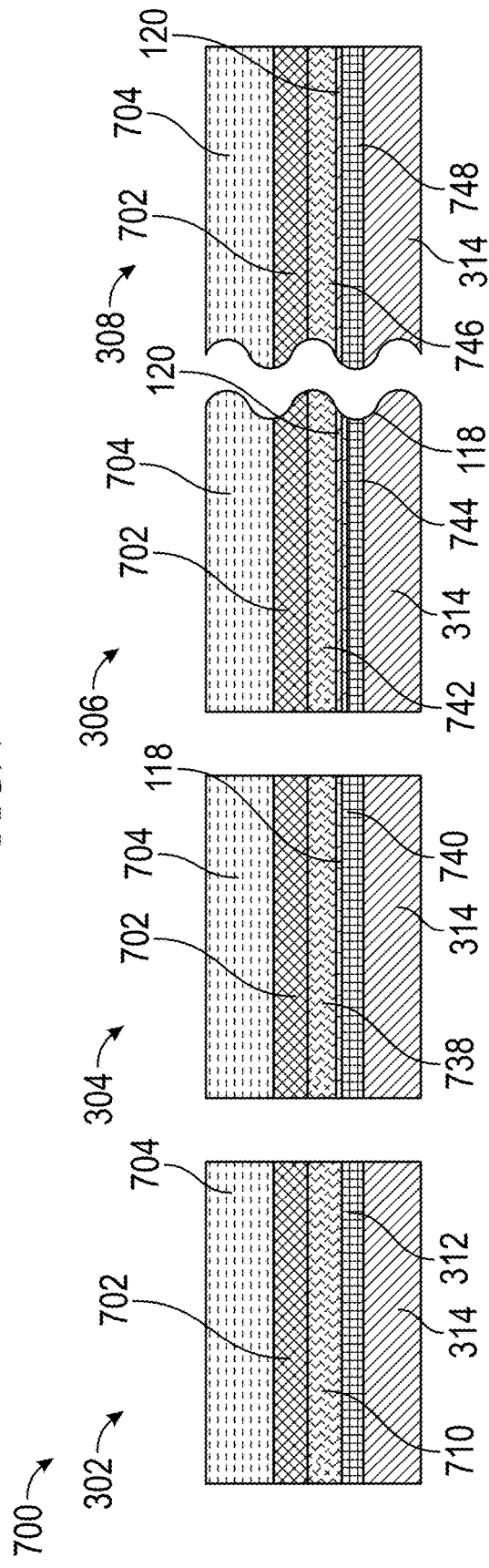

At 206, produce a third precursor structure 500 (as shown in FIG. 6) by depositing a second high-k dielectric layer (HK2) 502 over all four templates 302, 304, 306, 308. In one or more embodiments, HK2 502 is similar in composition as HK1 310, and is on the order of 3-5 angstroms thick (e.g., thickness just sufficient to protect the first dipole material 402). At 208, produce a fourth precursor structure 600 (as shown in FIG. 7) by depositing a second dipole material 602 onto the third template 306 and the fourth template 308. In one or more embodiments, the second dipole material 602 is aluminum oxide or similar, at an ultra-thin thickness of 1 to 10 angstroms. At 210, produce a fifth precursor structure 700 (as shown in FIG. 8) by depositing a metal capping layer 702 (containing materials such as, e.g., titanium nitride) and an anneal capping layer 704 (containing materials such as, e.g., amorphous silicon (a-Si)), then thermal annealing from 700° C. to 1200° C. to diffuse or "drive in" the first and second dipole materials 402, 602 (as seen in FIG. 7) downward to an interface of the interfacial dielectric 312 and the high-k dielectric layer 310, thereby forming dipole layers 118, 120 and different IL and HK on each of the templates 302, 304, 306, 308, i.e. on template 302 there are HK 710 and IL 312, on template 304 there are HK 738 and IL 740 (containing the first dipole), on template 306 there are HK 742 and IL 744 (containing the first dipole and second dipole), and on template 308 there are HK 746 and IL 748 (containing the second dipole).

Then, at 212, complete the structure 100 (as shown in FIG. 1) by stripping the metal capping layer 702 and the anneal capping layer 704, then forming the work function metal layer 110, thereby producing device 102 having threshold voltage Vt0 with HK 112, IL 114, device 104 having threshold voltage Vt1 with HK 138, IL 140, device 106 having threshold voltage Vt2 with HK 142, IL 144, and device 108 having threshold voltage Vt3 with HK 146, IL 148. When the transistor 100 is an nFET, the Vt order could be, for example: Vt1<Vt2<Vt0<Vt3. When the transistor 100 is a pFET, the Vt order could be, for example: |Vt3|<|Vt0|<|Vt2|<|Vt1|.

Thus, an overall process flow, according to an exemplary embodiment, is: form transistor structure; form IL and partial HK (or HK1); selectively form a first dipole thin film (one kind of dipole, e.g., $La_2O_3$); form the partial HK (or HK2) as a protection layer and a high-k dielectric; selectively form a second dipole thin film (another kind of dipole, e.g., $Al_2O_3$); deposit an HK cap layer and deposit an encapsulation layer; drive-in anneal; strip the HK cap layer and encapsulation layer; and form the metal gate (work function metal layer).

In one or more embodiments, aspects of interest include: selectively depositing different kinds of dipoles on different parts of a structure to form devices with distinct threshold voltages on a common substrate, where at least one device has both kinds of dipoles between the IL and the HK for Vt definition; and splitting deposition of a high-k dielectric into a first part that is used as a base layer and a second part that is used as a protection cap and dielectric.

Previously, well implant techniques were employed to tune the threshold voltage in complementary metal-oxide semiconductor (CMOS) technology. However, when a thin body is used for the gate channel to improve electrostatics, threshold voltage tuning by well implant becomes challenging. In a normal region, the Vt tune region is only around 10 mV, which is difficult to use to center or define a Vt when needed. For future advanced transistors, volumeless multi-Vt is projected to be the point-of-reference ("POR") for Vt definition for transistor scaling because of little space occupation. Advantageously, embodiments of the present invention make Vt center and minor tuning much easier than achievable by well implant.

In one or more embodiments, work function metal (WFM) is disposed over the gate dielectric layer in both the nFET and pFET regions (in embodiments having both types of regions) to complete the gate stacks. Non-limiting examples of suitable work function (gate) metals include p-type work function metal materials and n-type work function metal materials. P-type work function materials include compositions such as ruthenium, palladium, platinum, cobalt, nickel, and conductive metal nitrides such as TiN, WN, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

The work function metal(s) may be deposited by a suitable deposition process, for example, ALD, CVD, PECVD, PVD, plating, and thermal or e-beam evaporation. Pinch-off of work function metal material between semiconductor fins is essentially avoided during deposition. The WFM layer is removed from one of the nFET and pFET regions in structures including both types of regions while the other region is protected. An SC1 etch, an SC2 etch or other suitable etch processes can be employed to remove the selected portion of the originally deposited WFM layer. A new WFM layer suitable for the region is then deposited. A device formed in the nFET region will accordingly include a WFM layer (gate electrode) having a first composition while a device in the pFET region will have a WFM layer having a second composition. For example, the WFM employed in an nFET region may be a Ti, Al, TiAl, TiAlC or TiAlC layer or a metal stack such as TiN/TiAl/TiN, TiN/TiAlC/TiN, TiN/TaAlC/TiN, or any combination of an aluminum alloy and TiN layers. The WFM layer employed in the pFET region may, for example, be a TiN, TiC, TaN or a tungsten (W) layer. The threshold voltage (Vt) of nFET devices is sensitive to the thickness of work function metals such as titanium nitride (TiN).

Figure 9:
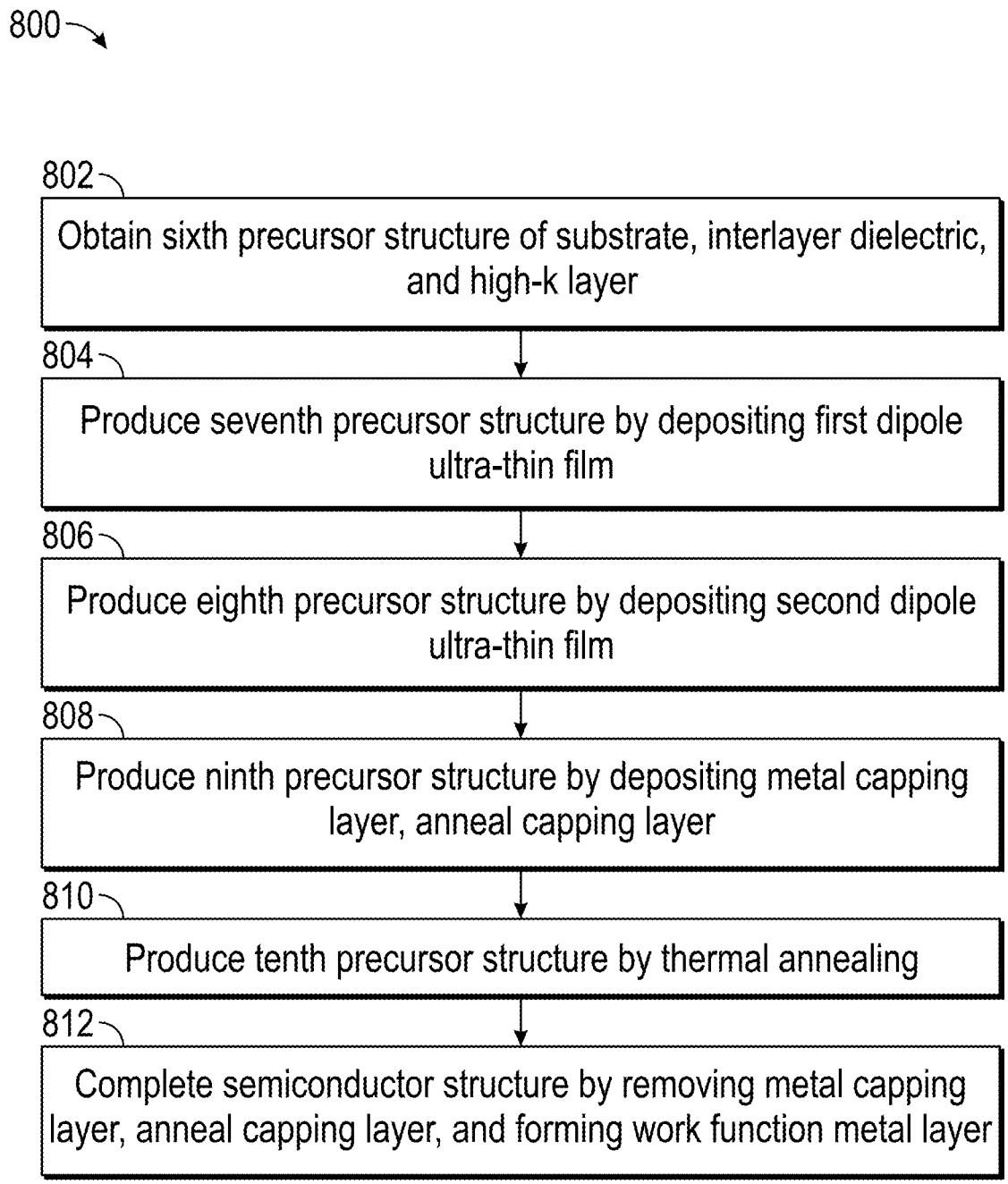
FIG. 9 depicts steps of another method for fabricating the structure of FIG. 1, according to an exemplary embodiment.

According to an exemplary embodiment, a method 800 as shown in FIG. 9 can be used to fabricate the structure 100 as shown in FIG. 1. At 802, obtain a sixth precursor structure 900 (as shown in FIG. 10) that includes four templates 902, 904, 906, 908, each having a high-k dielectric layer 910 on top of an interfacial dielectric 312 and a common substrate 314. In one or more embodiments, the high-k dielectric layer 910 is generally thicker than the first high-k dielectric layer 310 of FIG. 4. At 804, produce a seventh precursor structure 1000 (as shown in FIG. 11) that has the first dipole layer 1002 on top of the high-k dielectric layer 910 on the sixth template 904 and on the seventh template 906.

Figure 13:
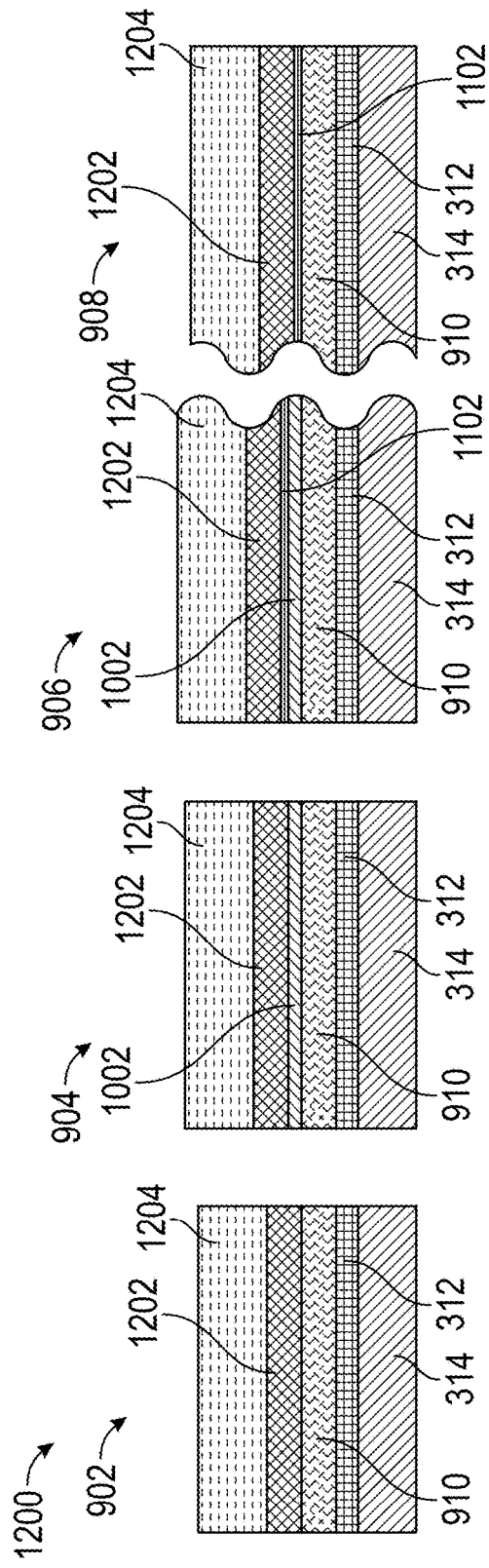
Figure 14:
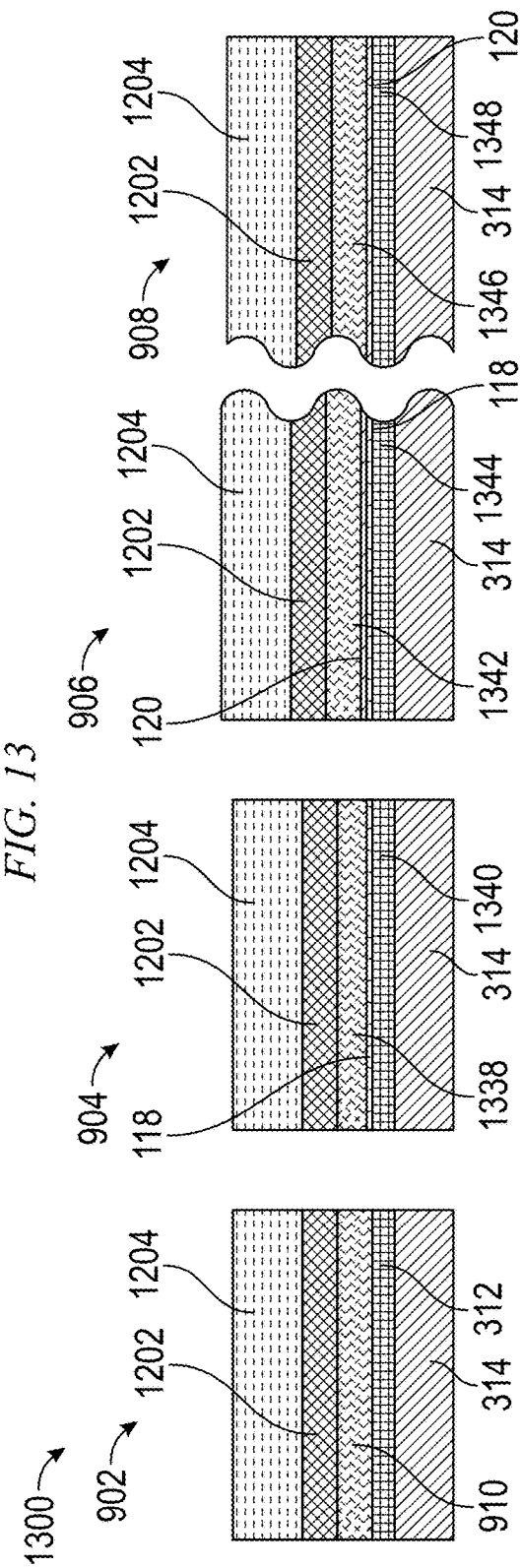

At 806, produce an eighth precursor structure 1100 (as shown in FIG. 12) by depositing the second dipole layer 1102 atop the seventh template 906 and the eighth template 908. At 808, produce a ninth precursor structure 1200 (as shown in FIG. 13) by depositing metal capping layer 1202 (e.g., titanium nitride) and anneal capping layer 1204 (e.g., a-Si) across all the templates. At 810, produce a tenth precursor structure 1300 (as shown in FIG. 14) by thermal annealing from 700° C. to 1200° C. to drive the dipole materials 1002, 1102 down to an interface between the high-k dielectric layer 910 and the interfacial dielectric 312, thereby forming dipole layers 118, 120 and different IL and HK on each of the templates 902, 904, 906, 908, i.e. on template 902 there are HK 910 and IL 312, on template 904 there are HK 1338 and IL 1340 (containing the first dipole), on template 906 there are HK 1342 and IL 1344 (containing the first dipole and the second dipole), and on template 908 there are HK 1346 and IL 1348 (containing the second dipole). At 812, complete the structure 100 by stripping the metal capping layer 1202 and the anneal capping layer 1204, then forming the work function metal layer 110.

Given the discussion thus far, and with reference to accompanying drawings, it will be appreciated that, in general terms, an exemplary semiconductor structure, according to an aspect of the invention, includes a semiconductor substrate 116, a first n-type field effect transistor (FET) 102 formed on the substrate, and a second nFET 104 formed on the substrate. The first nFET has a first threshold voltage (Vt0) and a gate of the first nFET includes a gate electrode and a first work function metal (WFM) 110 layered with a first interfacial layer (IL) 114 and a first high-k dielectric (HK) 112. The second nFET has a second threshold voltage (Vt1) and a gate of the second nFET includes a gate electrode and the first WFM layered with a second IL, a second HK, and a first dipole material 118. The exemplary semiconductor structure also includes a third nFET 106 formed on the substrate. The third nFET has a third threshold voltage (Vt2) and a gate of the third nFET includes a gate electrode and the first WFM layered with a third IL, a third HK, the first dipole material, and a second dipole material 120. The first nFET does not include the first dipole material and does not include the second dipole material, and the second nFET does not include the second dipole material, such that Vt1<Vt2<Vt0.

In one or more embodiments, the first dipole material is present in the second IL and the second HK on the second nFET and in the third IL and the third HK on the third nFET. In one or more embodiments, the second dipole material is present in the third IL and the third HK on the third nFET. In one or more embodiments, the first dipole material and the second dipole material, where present, are in the form of ultra-thin films. In one or more embodiments, the first dipole material shifts threshold voltage toward a conduction band of a semiconductor. In one or more embodiments, the first dipole material includes lanthanum, yttrium, magnesium, and/or gadolinium. In one or more embodiments, the second dipole material shifts threshold voltage toward a valence band of a semiconductor. In one or more embodiments, the second dipole material includes aluminum, manganese, and/or titanium.

In one or more embodiments, the exemplary structure also includes a fourth nFET 108 formed on the substrate. The fourth nFET has a threshold voltage Vt3 and a gate of the fourth nFET includes a gate electrode and the first WFM layered with a fourth IL and a fourth HK. Vt0<Vt3. On the fourth nFET the second dipole material is present and the first dipole material is not present in the fourth IL and the fourth HK.

According to another aspect, another exemplary semiconductor structure includes a semiconductor substrate 116, a first p-type field effect transistor (FET) 102 formed on the substrate, and a second pFET 104 formed on the substrate. The first pFET has a first threshold voltage (Vt0) and a gate of the first pFET includes a gate electrode, a first work function metal (WFM) layered with a first interfacial layer (IL) and a first high-k dielectric (HK). The second pFET has a second threshold voltage (Vt1) and a gate of the second pFET includes the first WFM layered with a second IL, a second HK, and a first dipole material 118. A third pFET 108 also is formed on the substrate. The third pFET has a third threshold voltage (Vt2) and a gate of the third pFET includes the first WFM layered with a third IL, a third HK, the first dipole material, and a second dipole material 120. The first pFET does not include the first dipole material and does not include the second dipole material, and the second pFET does not include the second dipole material, such that $|Vt0|<|Vt2|<|Vt1|$.

In another aspect, a semiconductor structure includes a semiconductor substrate; a first field effect transistor (FET) formed on the substrate; and a second field effect transistor (FET) formed on the substrate. The first field effect transistor is an n-type field effect transistor (nFET). The nFET has a first threshold voltage (Vt0) and a gate of the nFET includes a gate electrode and a first work function metal (WFM) layered with a first interfacial layer (IL), a first high-k dielectric (HK), and a first dipole material. The second field effect transistor is a p-type FET (pFET). The pFET has a second threshold voltage (Vt1) and a gate of the pFET includes a gate electrode and a first work function metal (WFM) layered with a second interfacial layer, a second high-k dielectric, and a second dipole material.

According to another aspect, a method 200 or 800 for fabricating a semiconductor structure includes, at 202 or 802, obtaining a first precursor structure that includes a first template, a second template, a third template, and a fourth template. All the templates include a first high-k dielectric layer and an interlayer dielectric on a common substrate. Then, at 204 or 804, deposit a first dipole material onto the second template and the third template. At 208 or 806, deposit a second dipole material onto the third template and the fourth template.

In one or more embodiments, the exemplary method further includes, at 210 or 808 depositing a metal capping layer onto all the templates and depositing an anneal capping layer onto the metal capping layer; then, at 210 or 810, driving the first and second dipole materials to an interface between the interlayer dielectric and the first high-k dielectric layer by thermally annealing the structure.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures.

A number of different precursors may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, disilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

By "in-situ" it is meant that the dopant that dictates the conductivity type of doped layer is introduced during the process step, for example epitaxial deposition, that forms the doped layer. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

As used herein, the term "conductivity type" denotes a dopant region being p-type or n-type.

As an exemplary subtractive process, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (ME), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling $1^{st}$ Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a semiconductor substrate;
   a first n-type field effect transistor (nFET) formed on the substrate, wherein the first nFET has a first threshold voltage (Vt0) and a gate of the first nFET comprises a gate electrode and a first work function metal (WFM) layered with a first interfacial layer (IL) and a first high-k dielectric (HK);
   a second nFET formed on the substrate, wherein the second nFET has a second threshold voltage (Vt1) and a gate of the second nFET comprises a gate electrode and the first WFM layered with a second IL, a second HK, and a first dipole material; and
   a third nFET formed on the substrate, wherein the third nFET has a third threshold voltage (Vt2) and a gate of the third nFET comprises a gate electrode and the first WFM layered with a third IL, a third HK, the first dipole material, and a second dipole material,
   wherein the first nFET does not include the first dipole material and does not include the second dipole material, and the second nFET does not include the second dipole material, such that Vt1<Vt2<Vt0.

2. The semiconductor structure of claim 1, wherein:
   the first dipole material is present in the second IL and the second HK on the second nFET and in the third IL and the third HK on the third nFET.

3. The semiconductor structure of claim 2, wherein:
   the second dipole material is present in the third IL and the third HK on the third nFET.

4. The semiconductor structure of claim 1, wherein:
   the second dipole material is present in the third IL and the third HK on the third nFET.

5. The semiconductor structure of claim 1, wherein the first dipole material shifts threshold voltage toward a conduction band of a semiconductor.

6. The semiconductor structure of claim 5, wherein the first dipole material comprises at least one material selected from a list consisting of: lanthanum, yttrium, magnesium, gadolinium.

7. The semiconductor structure of claim 1, wherein the second dipole material shifts threshold voltage toward a valence band of a semiconductor.

8. The semiconductor structure of claim 7, wherein the second dipole material comprises at least one material selected from a list consisting of: aluminum, manganese, titanium.

9. The semiconductor structure of claim 1, further comprising:
   a fourth nFET formed on the substrate, wherein the fourth nFET has a threshold voltage Vt3 and a gate of the fourth nFET comprises a gate electrode and the first WFM layered with a fourth IL and a fourth HK,
   wherein Vt0<Vt3, and
   wherein on the fourth nFET the second dipole material is present between the fourth IL and the fourth HK and in the fourth IL and the fourth HK, but the first dipole material is not present on the fourth nFET.

10. The semiconductor structure of claim 1, wherein the first work function metal (WFM) is a single metal layer containing Al and Ti.

11. The semiconductor structure of claim 1, wherein the first work function metal (WFM) is a metal stack comprising multiple layers of one or more materials selected from a list consisting of: metal nitride, metal alloy, metal carbide, and pure metal.

* * * * *